(12) United States Patent
Rodriguez et al.

(10) Patent No.: US 12,044,748 B2
(45) Date of Patent: Jul. 23, 2024

(54) SINGLE CELL FAULT TOLERANT BATTERY SYSTEM ARCHITECTURE

(71) Applicant: GENERAL ATOMICS, San Diego, CA (US)

(72) Inventors: Gilberto Fernando Rodriguez, San Diego, CA (US); Boris Tyrol, San Diego, CA (US); Scott Brian Mahar, Poway, CA (US); Gordon F. Smith, II, San Diego, CA (US); Corey John Jaskolski, Windsor, CO (US)

(73) Assignee: General Atomics, San Diego, CA (US)

( * ) Notice: Subject to any disclaimer, the term of this patent is extended or adjusted under 35 U.S.C. 154(b) by 233 days.

(21) Appl. No.: 17/840,475

(22) Filed: Jun. 14, 2022

(65) Prior Publication Data
US 2022/0308121 A1 Sep. 29, 2022

Related U.S. Application Data

(62) Division of application No. 16/020,717, filed on Jun. 27, 2018, now Pat. No. 11,391,784.

(51) Int. Cl.
*G01R 31/396* (2019.01)
*H01M 10/0525* (2010.01)
(Continued)

(52) U.S. Cl.
CPC ...... *G01R 31/396* (2019.01); *H01M 10/0525* (2013.01); *H01M 10/4207* (2013.01);
(Continued)

(58) Field of Classification Search
CPC ............ G01R 31/396; H01M 10/0525; H01M 10/4207; H01M 10/613; H01M 10/6556;
(Continued)

(56) References Cited

U.S. PATENT DOCUMENTS 6,087,036 A 7/2000 Rouillard
7,433,794 B1 10/2008 Berdichevsky
(Continued)

FOREIGN PATENT DOCUMENTS

CN 206834265 * 1/2018 ........ H01M 10/0525
JP 2011521403 7/2011
(Continued)

OTHER PUBLICATIONS

English Translation of CN206834265.*
(Continued)

*Primary Examiner* — Kiran Quraishi Akhtar
(74) *Attorney, Agent, or Firm* — Fitch, Even, Tabin & Flannery LLP

(57) ABSTRACT

A battery system may include multiple battery cells grouped into modules. Each battery module may have a diffuser plate to direct the hot gases and molten material that are ejected during cell failure. The gas and material may be directed away from the nearest neighboring cells in the event of a single cell thermal runaway. Residual thermal energy is wicked away, absorbed or contained to keep heat away from the neighboring cells. These and other features may manage the blast energy and residual thermal energy of a single cell failure event. This may prevent a cascading failure of the larger battery system, thereby mitigating the risk of injury to personnel and property.

17 Claims, 5 Drawing Sheets

(51) Int. Cl.
   *H01M 10/42*   (2006.01)
   *H01M 10/613*  (2014.01)
   *H01M 50/213*  (2021.01)
   *H01M 50/293*  (2021.01)

(52) U.S. Cl.
   CPC ....... *H01M 10/613* (2015.04); *H01M 50/213* (2021.01); *H01M 50/293* (2021.01)

(58) Field of Classification Search
   CPC ............. H01M 10/659; H01M 10/637; H01M 50/213; H01M 50/293; H01M 50/581; H01M 50/367; H01M 2200/00; H01M 10/42; Y02E 60/10
   See application file for complete search history.

(56) References Cited

U.S. PATENT DOCUMENTS

| | | | |
|---|---|---|---|
| 8,399,118 | B2 | 3/2013 | Gadawski |
| 8,415,043 | B2 | 4/2013 | Flannery |
| 11,391,784 | B2 | 7/2022 | Rodriguez |
| 11,923,494 | B2 * | 3/2024 | Erb ................... H01M 10/6556 |
| 2007/0009787 | A1 | 1/2007 | Straubel |
| 2008/0124617 | A1 | 5/2008 | Bjork |
| 2009/0297892 | A1 | 12/2009 | Ijaz |
| 2011/0091749 | A1 | 4/2011 | Chow |
| 2012/0040255 | A1 | 2/2012 | Hermann |
| 2012/0121949 | A1 | 5/2012 | Eberhard |
| 2012/0141843 | A1 | 6/2012 | Gutsch |
| 2012/0153901 | A1 | 6/2012 | Hermann |
| 2012/0231306 | A1 | 9/2012 | Herron |
| 2012/0237803 | A1 | 9/2012 | Mardall |
| 2012/0270080 | A1 | 10/2012 | Hermann |
| 2012/0308857 | A1 | 12/2012 | Hermann |
| 2012/0308858 | A1 | 12/2012 | Hermann |
| 2012/0308859 | A1 | 12/2012 | Hermann |
| 2013/0004820 | A1 | 1/2013 | Tennessen |
| 2013/0034751 | A1 | 2/2013 | Geng |
| 2013/0049971 | A1 | 2/2013 | Hermann |
| 2013/0183566 | A1 | 7/2013 | Wayne |
| 2013/0196184 | A1 | 8/2013 | Faass |
| 2014/0178722 | A1 | 6/2014 | Straubel |
| 2014/0212708 | A1 | 7/2014 | Frey |
| 2015/0236315 | A1 | 8/2015 | Hofer |
| 2015/0244036 | A1 | 8/2015 | Lane |
| 2016/0006007 | A1 | 1/2016 | Takasaki |
| 2016/0218336 | A1 | 7/2016 | Herrmann |
| 2016/0254578 | A1 | 9/2016 | Liu |
| 2016/0344072 | A1 * | 11/2016 | Chan ................. H01M 10/6551 |
| 2017/0012331 | A1 * | 1/2017 | Ng ................... H01M 10/0422 |
| 2017/0077487 | A1 | 3/2017 | Coakley |
| 2017/0309914 | A1 | 10/2017 | Drews |
| 2018/0138478 | A1 | 5/2018 | Chan |
| 2018/0145292 | A1 | 5/2018 | Lampe-Onnerud |
| 2020/0003840 | A1 | 1/2020 | Rodriguez |

FOREIGN PATENT DOCUMENTS

| | | |
|---|---|---|
| JP | 2015138711 | 7/2015 |
| WO | 2011064956 | 6/2011 |
| WO | 2012167269 | 12/2012 |
| WO | 2016120060 | 8/2016 |
| WO | 2018003478 | 1/2018 |

OTHER PUBLICATIONS

Extended European Search Report for EP Application No. 19179734.9 mailed from the European Patent Office on Nov. 28, 2019.
First Examination Report for AU Application No. 2019204182 issued by the Australian Government IP Australia on Jun. 29, 2020.
First Examination Report for India Patent Application No. 201944024685 issued by the Indian Patent Office on Aug. 18, 2021.
Notice of Reasons for Rejection for Japanese Patent Application No. 2019-112322 mailed from the Japan Patent Office on Aug. 24, 2020, with English translation, 9 pages.
Rodriguez et al; U.S. Appl. No. 16/020,717, filed Jun. 27, 2018.
Rodriguez et al; U.S. Appl. No. 17/840,495, filed Jun. 14, 2022.
USPTO; Advisory Action issued in U.S. Appl. No. 16/020,717 mailed Aug. 18, 2021.
USPTO; Final Office Action issued in U.S. Appl. No. 16/020,717 mailed Jun. 8, 2021.
USPTO; Non-Final Office Action issued in U.S. Appl. No. 16/020,717 mailed Nov. 27, 2020.
USPTO; Notice of Allowance issued in U.S. Appl. No. 16/020,717 issued Mar. 15, 2022.
USPTO; Restriction Requirement issued in U.S. Patent No. U.S. Appl. No. 16/020,717 mailed Sep. 11, 2020.

* cited by examiner

SINGLE CELL FAULT TOLERANT BATTERY SYSTEM ARCHITECTURE

This application is a divisional of U.S. application Ser. No. 16/020,717, filed Jun. 27, 2018, for SINGLE CELL FAULT TOLERANT BATTERY SYSTEM ARCHITECTURE, which is incorporated in its entirety herein by reference.

BACKGROUND OF THE INVENTION

1. Field of the Invention

The present invention relates generally to preventing battery failure, and more specifically to preventing battery failure by preventing cell failure propagation.

2. Discussion of the Related Art

Various systems and processes are known in the art for preventing battery failure by preventing cell failure propagation. Batteries come in many shapes and sizes, from miniature cells used to power hearing aids and wristwatches to small, thin cells used in smartphones, to large lead acid batteries used in cars and trucks, and at the largest extreme, huge battery banks the size of rooms that provide standby or emergency power for telephone exchanges and computer data centers. Batteries may generate excess heat which may impede reliability and lead to premature failure. In some cases, the amount of heat output is related to the power output of the battery. Techniques for managing this excess heat may include heat sinks, thermoelectric coolers, forced air systems, fans, heat pipes, and others.

Some battery systems utilize lithium ion chemistry for higher energy storage capability, but these systems may have an increased risk of large battery fires. A defect inside a lithium ion cell can result in an explosion, with the concurrent emittance of fire and gases. When a lithium ion cell goes into thermal runaway, the energy released can be divided into two categories: blast and residual. The blast energy is composed of hot gases (similar to a blow torch), and molten metal, which is ejected from the cell. The residual thermal energy is the heat in the cell left behind after the cell has gone into thermal runway. A single cell failure can lead to a cascading failure of neighboring cells, and consequently, a large battery fire, which can jeopardize personnel and equipment.

SUMMARY

A battery system may include multiple battery cells grouped into modules. Each battery module may have a diffuser plate to direct the hot gases and molten material that are ejected during cell failure. The gas and material may be directed away from the nearest neighboring cells in the event of a single cell thermal runaway. Residual thermal energy is wicked away, absorbed or contained to keep heat away from the neighboring cells. These and other features may manage the blast energy and residual thermal energy of a single cell failure event. This may prevent a cascading failure of the larger battery system, thereby mitigating the risk of injury to personnel and property.

In one embodiment, a module may include a plurality of lithium ion electrochemical cells, wherein each of the plurality of the lithium ion electrochemical cells is configured to generate electrical energy from chemical reactions, each of the plurality of the lithium ion electrochemical cells comprising a respective first end and a respective second end, wherein each respective first end comprises a respective vent, wherein each of said plurality of lithium ion electrochemical cells is aligned along parallel axes with each other of said plurality of lithium ion electrochemical cells with each said respective first end in a first direction, and each said respective second end in a second direction, a first bus electrically coupled to respective first electrodes of each of said plurality of lithium ion electrochemical cells at said respective first end, a second bus electrically coupled to respective second electrodes of each of said plurality of lithium ion electrochemical cells at said respective second end, and a diffuser plate juxtaposed with said first bus at said respective first end, wherein the diffuser plate is aligned with a plane normal to the parallel axes, the diffuser plate comprising a first side facing the respective first ends and a second side facing away from the respective first ends, the diffuser plate comprising channels on said first side.

A method of providing a system for preventing battery failure is described. The method may include providing a plurality of lithium ion electrochemical cells, wherein each of the plurality of the lithium ion electrochemical cells is configured to generate electrical energy from chemical reactions, each of the plurality of the lithium ion electrochemical cells comprising a respective first end and a respective second end, wherein each respective first end comprises a respective vent, aligning each of said plurality of lithium ion electrochemical cells is aligned along parallel axes with each other of said plurality of lithium ion electrochemical cells with each said respective first end in a first direction, and each said respective second end in a second direction; coupling a first bus electrically to respective first electrodes of each of said plurality of lithium ion electrochemical cells at said respective first end; coupling a second bus electrically to respective second electrodes of each of said plurality of lithium ion electrochemical cells at said respective second end; juxtaposing a diffuser plate with said first bus at said respective first end, comprising aligning the diffuser plate a plane normal to the parallel axes, the diffuser plate comprising a first side facing the respective first ends and a second side facing away from the respective first ends, the diffuser plate comprising channels on said first side.

A method of preventing battery failure is described. The method may include using a plurality of lithium ion electrochemical cells, wherein each of the plurality of the lithium ion electrochemical cells is configured to generate electrical energy from chemical reactions, each of the plurality of the lithium ion electrochemical cells comprising a respective first end and a respective second end, wherein each respective first end comprises a respective vent, wherein each of said plurality of lithium ion electrochemical cells is aligned along parallel axes with each other of said plurality of lithium ion electrochemical cells with each said respective first end in a first direction, and each said respective second end in a second direction, using a first bus electrically coupled to respective first electrodes of each of said plurality of lithium ion electrochemical cells at said respective first end, using a second bus electrically coupled to respective second electrodes of each of said plurality of lithium ion electrochemical cells at said respective second end, and using a diffuser plate juxtaposed with said first bus at said respective first end, wherein the diffuser plate is aligned with a plane normal to the parallel axes, the diffuser plate comprising a first side facing the respective first ends and a second side facing away from the respective first ends, the diffuser plate comprising channels on said first side.

In some examples of the module described above, said plurality of lithium ion electrochemical cells comprises at least two lithium ion electrochemical cells.

Some examples of the module described above may also include a foam cell support comprising a plurality of tubes each of which holds one of said plurality of lithium ion electrochemical cells in a spaced-apart relationship relative to others of said plurality of lithium ion electrochemical cells. In some examples of the module described above, said foam cell support comprises polyurethane.

Some examples of the module described above may also include a first glass epoxy composite material interposed between said first bus and each of said plurality of said lithium ion electrochemical cells at said respective first end. Some examples of the module described above may also include a second glass epoxy composite material interposed between said second bus and each of said plurality of said lithium ion electrochemical cells at said respective second end.

In some examples of the module described above, said first glass epoxy composite material comprises G10. In some examples of the module described above, said second glass epoxy composite material comprises G10.

Some examples of the module described above may also include a heat sink layer juxtaposed with one of said first bus and said second bus. In some examples of the module described above, said heat sink layer comprises a phase change material.

Some examples of the module described above may also include a third bus electrically coupled to respective second electrodes of each of said plurality of lithium ion electrochemical cells at said respective second end, wherein the heat sink layer may be interposed between the second bus and the third bus.

Some examples of the module described above may also include a fuse interposed between the second bus and the third bus. Some examples of the module described above may also include a fuse coupled to one of said first bus and said second bus.

In some examples of the module described above, said first bus comprises nickel, and said second bus comprises nickel. In other examples of the module described above, said first bus comprises aluminum, and said second bus comprises aluminum. In yet other examples of the module described above, said first bus comprises copper, and said second bus comprises copper. In additional examples, of the module described above, said first bus comprises a combination of at least two of nickel, aluminum and copper, and said second but comprises a combination of at least two of nickel, aluminum and copper. Said first bus and said second bus can comprise different materials from one another selected from the above.

DETAILED DESCRIPTION

The following description is not to be taken in a limiting sense, but is made merely for the purpose of describing the general principles of exemplary embodiments. The scope of the invention should be determined with reference to the claims.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the disclosure may be combined in any suitable manner in one or more embodiments. In the following description, numerous specific details are provided. One skilled in the relevant art will recognize, however, that the disclosure can be practiced without one or more of the specific details, or with other methods, components, materials, and so forth. In other instances, well-known structures, materials, or operations are not shown or described in detail to avoid obscuring aspects of the disclosure.

A battery is a device that stores and discharges energy through the controlled conversion of chemical energy to electric energy. Energy is stored by preventing the flow of electrons between chemical reactants with different electric potential. Energy is released when electrons are allowed to flow between a positive terminal (cathode) and a negative terminal (anode). When the terminals are connected, the compounds undergo chemical reactions that are known as oxidation and reduction. The chemical reactions may cause a flow of electrolytes and drive current through a circuit.

Batteries may be classified by the type of electrochemical cells that contain the chemical reactants. Cell types include galvanic cells, electrolytic cells, fuel cells, flow cells, saltwater cells, molten salt cells, and voltaic piles. These cells may use a liquid electrolyte (wet cell) or a low-moisture paste (dry cell).

A battery may be either single-use (primary) or rechargeable (secondary). The chemical reactions of a primary battery may be irreversible, and the battery may stop producing current once it has exhausted the supply of chemical reactants. The chemical reactions of a secondary battery may be reversed by applying a voltage in the opposite direction thereby replenishing the supply of chemical reactants.

Figure 1:
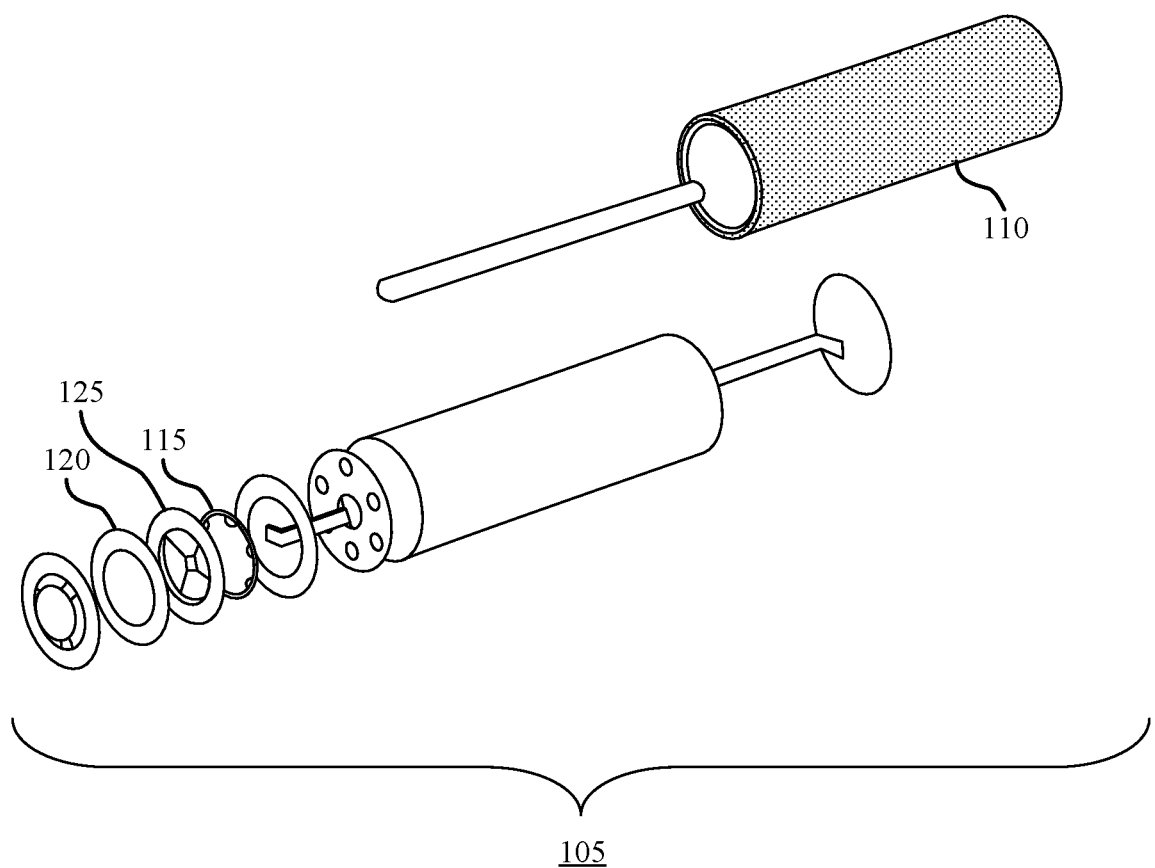
FIG. 1 illustrates an example of a cell that supports preventing battery failure by preventing cell failure propagation in accordance with aspects of the present disclosure.

FIG. 1 illustrates an example of a cell 105 that supports preventing battery failure by preventing cell failure propagation in accordance with aspects of the present disclosure. Cell 105 may be an example of, or incorporate aspects of, cell 225 as described with reference to FIG. 2.

In some examples, cell 105 may include can 110, current interrupt device (CID) 115, positive temperature coefficient (PTC) device 120, and vent 125.

Cell 105 may be an example of one of a plurality of lithium ion electrochemical components, wherein each of the plurality of the lithium ion electrochemical cells 105 is configured to generate electrical energy from chemical reactions, each of the plurality of the lithium ion electrochemical cells 105 comprising a respective first end and a respective second end, wherein each respective first end comprises a respective vent 125, wherein each of the plurality of lithium ion electrochemical cells 105 is aligned along parallel axes with each other of the plurality of lithium ion electrochemical cells 105 with each the respective first end in a first direction, and each the respective second end in a second direction. In variations of the present disclosure, electrochemical cells 105 may comprise the respective first end and the respective second end, wherein each respective second end comprises the respective vent 125. In further variations of the present disclosure, electrochemical cells 105 may comprise the respective first end and the respective second end, wherein each respective first end comprises the respective vent 125 and wherein each respective second end comprises another respective vent, such that each of the electrochemical cells has two vents, one at each of its first end and second end.

In some cases, the plurality of lithium ion electrochemical cells 105 comprises at least two lithium ion electrochemical cells 105. In one embodiment, each cell 105 may be a standard Lithium-Ion 18650 battery cell 105.

Figure 2:
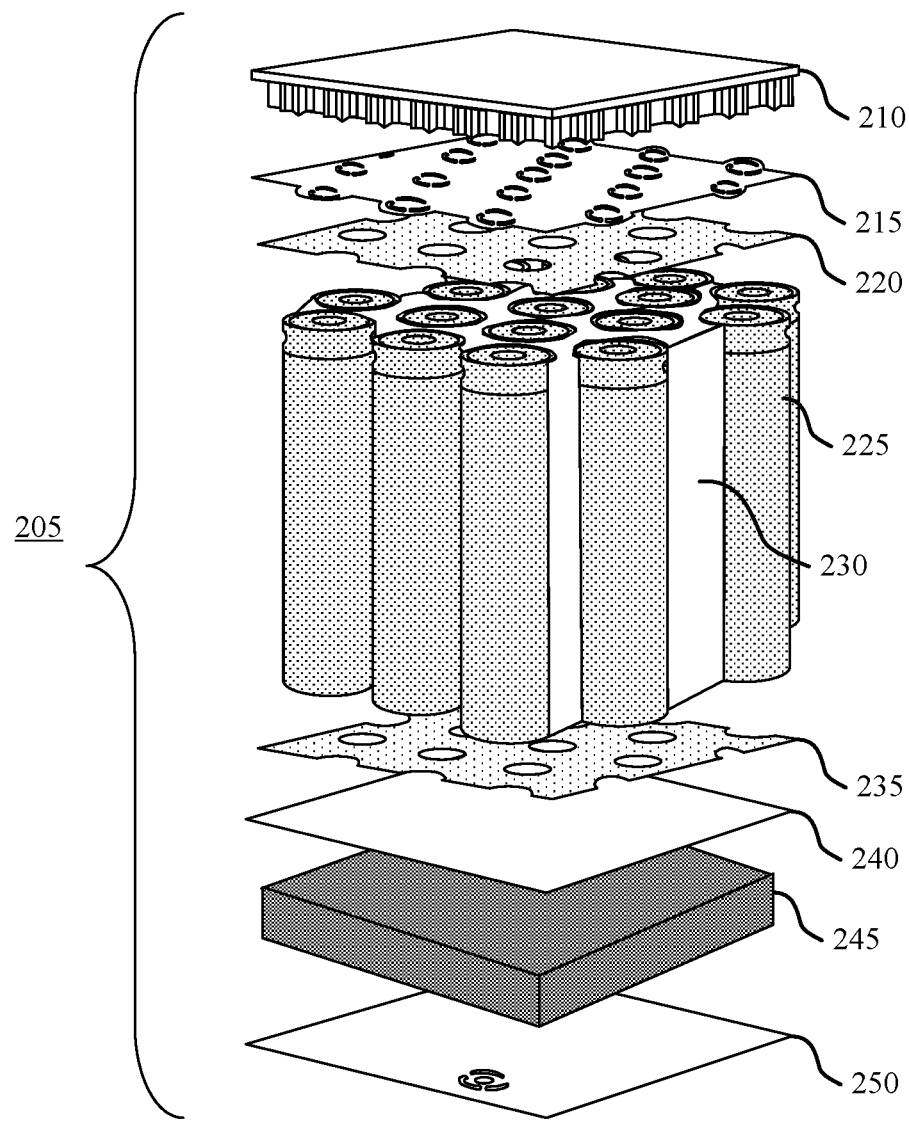
FIG. 2 illustrates an example of a module that supports preventing battery failure by preventing cell failure propagation in accordance with aspects of the present disclosure.

FIG. 2 illustrates an example of a module 205 that supports preventing battery failure by preventing cell failure propagation in accordance with aspects of the present disclosure. In some examples, module 205 may include diffuser plate 210, first bus plate 215, first composite plate 220, cell 225, cell support 230, second composite plate 235, second bus plate 240, heat sink layer 245, and third bus plate 250.

Diffuser plate 210 may be an example of, or incorporate aspects of, diffuser plate 305 and 405 as described with reference to FIGS. 3 and 4. Diffuser plate 210 may be juxtaposed with the bus plate 215 at the respective first end, wherein the diffuser plate 210 is aligned with a plane normal to the parallel axes, the diffuser plate 210 comprising a first side facing the respective first ends and a second side facing away from the respective first ends, the diffuser plate 210 comprising channels on the first side.

First bus plate 215 may be an example of a first bus electrically coupled to respective first electrodes of each of the plurality of lithium ion electrochemical cells 225 at the respective first end. In some cases, the first bus plate 215 comprises nickel, aluminum, copper or combinations thereof.

First composite plate 220 may be an example of a first glass epoxy composite material interposed between the first bus and each of the plurality of the lithium ion electrochemical cells 225 at the respective first end. In some cases, the first glass epoxy composite material comprises G10.

In a variation of the present disclosure, where each of the electrochemical cells has two vents, one at each of its first end and second end, a second diffuser plate may be an example of, or incorporate aspects of, diffuser plate 210, 305 and 405 as described with reference to FIGS. 2, 3 and 4. The second diffuser plate may be juxtaposed with a second bus plate 240, described below, at the respective second end, wherein the second diffuser plate is aligned with a plane normal to the parallel axes, the second diffuser plate comprising a first side facing the respective second ends and a second side facing away from the respective second ends, the second diffuser plate comprising channels on the first side.

Cell 225 may be an example of, or incorporate aspects of, cell 105 as described with reference to FIG. 1.

Cell support 230 may be an example of a foam component comprising a plurality of tubes each of which holds one of the plurality of lithium ion electrochemical cells 225 in a spaced-apart relationship relative to others of the plurality of lithium ion electrochemical cells 225. In some cases, the foam cell support 230 comprises polyurethane.

Second composite plate 235 may be an example of a second glass epoxy composite material interposed between the second bus and each of the plurality of the lithium ion electrochemical cells 225 at the respective second end. In some cases, the second glass epoxy composite material comprises G10.

Second bus plate 240 may be an example of a second bus electrically coupled to respective second electrodes of each of the plurality of lithium ion electrochemical cells 225 at the respective second end; be an example of a fuse coupled to one of the first bus plate 215 and the second bus plate 240. In some cases, second bus plate 240 comprises nickel, aluminum, copper or combinations thereof.

Heat sink layer 245 may be an example of a component juxtaposed with one of the first bus and the second bus. In some cases, the heat sink layer comprises a phase change material.

Third bus plate 250 may be an example of a third bus electrically coupled to respective second electrodes of each of the plurality of lithium ion electrochemical cells 225 at the respective second end, wherein the heat sink layer 245 is interposed between the second bus plate 240 and the third bus plate 250 and be an example of a fuse interposed between the second bus plate 240 and the third bus plate 250.

One or more cells 225 may be combined into a battery module 205. Each battery module 205 may include a heat sink (e.g. made from an aluminum-nickel phase change material). The module 205 may also include a flame resistant cell support 230 structure. Diffuser plates 210 may direct hot vent gases past neighboring cells 225 in the event of a failure. Cell spacing and fusing may also be designed in a manner to prevent propagation of cell 225 failure. Cells 225 are clamped together with one or more non-conductive rods, and connected in series with copper connecting bars. In some cases, slide pads are bonded to the foam support structure, to assist in inserting the half-string into battery pressure vessel. In some cases, integrated cooling fans are connected to each module 205.

In some examples, one or more battery modules 205 may be combined to form a battery system. For example, support brackets may be used to connect adjoining battery modules 205. Sliding electrical connectors may also assist in joining adjacent battery modules 205. Brackets may be used to bolt together frames between modules 205 to create a structurally solid module 205 pair. The frame may serve as a plenum between two battery modules 205 to allow the cooling fans to push air between them. Channels in the frame may guide the air into the diffuser plates 210. The battery system may perform the functions of passive cell 225 balancing, temperature sensing, health monitoring, and cell 225 cooling (both passive and active).

A diffuser plate 210 may be constructed from a metallic material such as aluminum. It may include channels that allow for venting gases, and overflow chambers to accommodate cell 225 swelling and molten debris collection. Flex tabs in the first bus plate 215 may allow for cell 225 swelling, venting, and low heat transfer between cells 225. The second bus plate 240 may facilitate heat dissipation within a cell 225 group. A phase change heat sink layer 245 may be located between the second bus plate 240 and the third bus plate 250. The third bus plate 250 may include a group fuse component.

Figure 3:
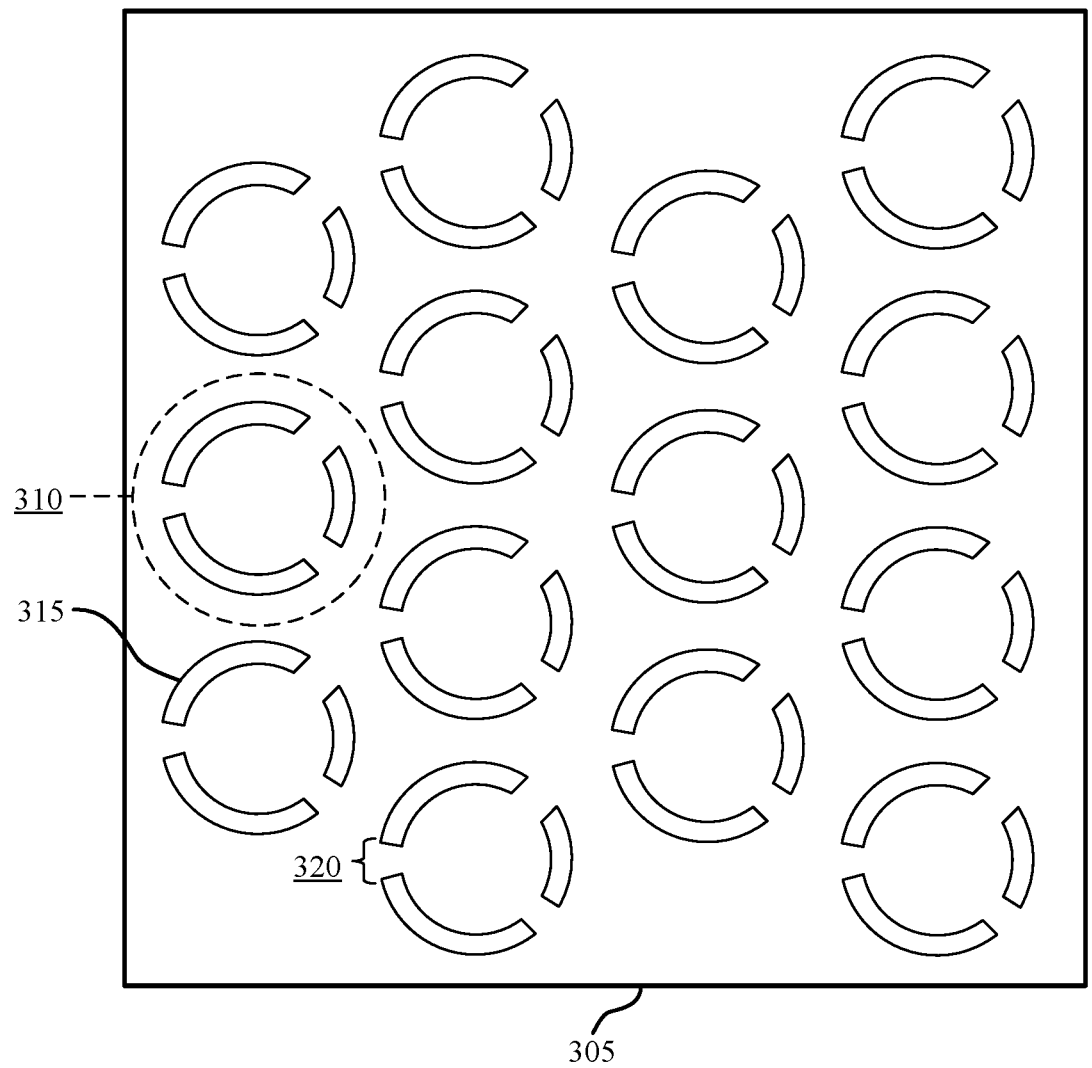
FIG. 3 illustrates an example of a diffuser plate arrangement that supports preventing battery failure by preventing cell failure propagation in accordance with aspects of the present disclosure.

FIG. 3 illustrates an example of a diffuser plate 305 arrangement that supports preventing cell failure propagation in accordance with aspects of the present disclosure. Diffuser plate 305 may be an example of, or incorporate aspects of, diffuser plate 210 and 405 as described with reference to FIGS. 2 and 4. In some examples, diffuser plate 305 may include diverter 310.

Diverter 310 may be an example of, or incorporate aspects of, diverter 410 as described with reference to FIG. 4. In some examples, diverter 310 may include arc 315 and gap 320.

Arc 315 may be an example of, or incorporate aspects of, arc 415 as described with reference to FIG. 4. Gap 320 may be an example of, or incorporate aspects of, gap 420 as described with reference to FIG. 4.

The diffuser plate 305 may include multiple diverters 310. Each diverter 310 may be located directly above a cell, and may have one or more arcs 315 separated by gaps 320. The gaps 320 may be arranged to divert vented gases in a direction that does not directly face any other cell.

Figure 4:
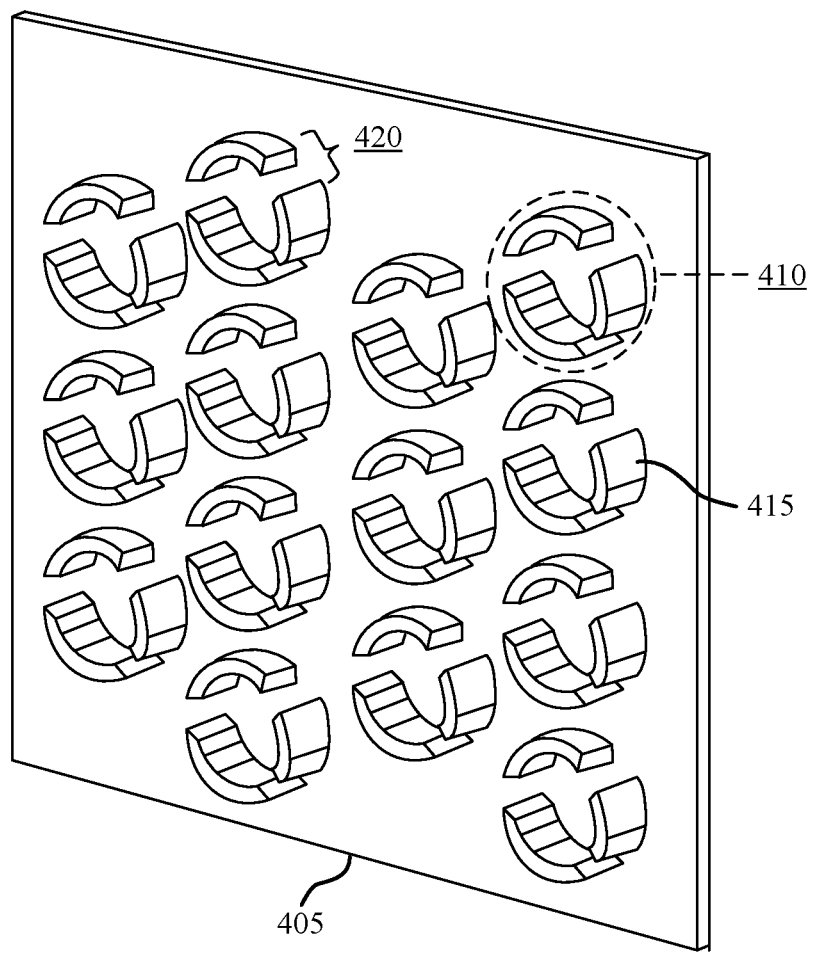
FIG. 4 illustrates an example of an angled view of a diffuse plate arrangement that supports preventing battery failure by preventing cell failure propagation in accordance with aspects of the present disclosure.

FIG. 4 illustrates an example of an angled view of a diffuser plate arrangement that supports preventing battery failure by preventing cell failure propagation in accordance with aspects of the present disclosure. Diffuser plate 405 may be an example of, or incorporate aspects of, diffuser plate 210 and 305 as described with reference to FIGS. 2 and 3. In some examples, diffuser plate 405 may include diverter 410.

Diverter 410 may be an example of, or incorporate aspects of, diverter 310 as described with reference to FIG. 3. In some examples, diverter 410 may include arc 415 and gap 420.

Arc 415 may be an example of, or incorporate aspects of, arc 315 as described with reference to FIG. 3. Gap 420 may be an example of, or incorporate aspects of, gap 320 as described with reference to FIG. 3.

The diffuser plate 405 may include multiple diverters 410. Each diverter 410 may be located directly above a cell, and may have one or more arcs 415 separated by gaps 420. The gaps 420 may be arranged to divert vented gases in a direction that does not directly face any other cell. As shown in FIG. 4, each arc comprises a curved cross-section oriented parallel to the diffuser plate alignment.

Figure 5:
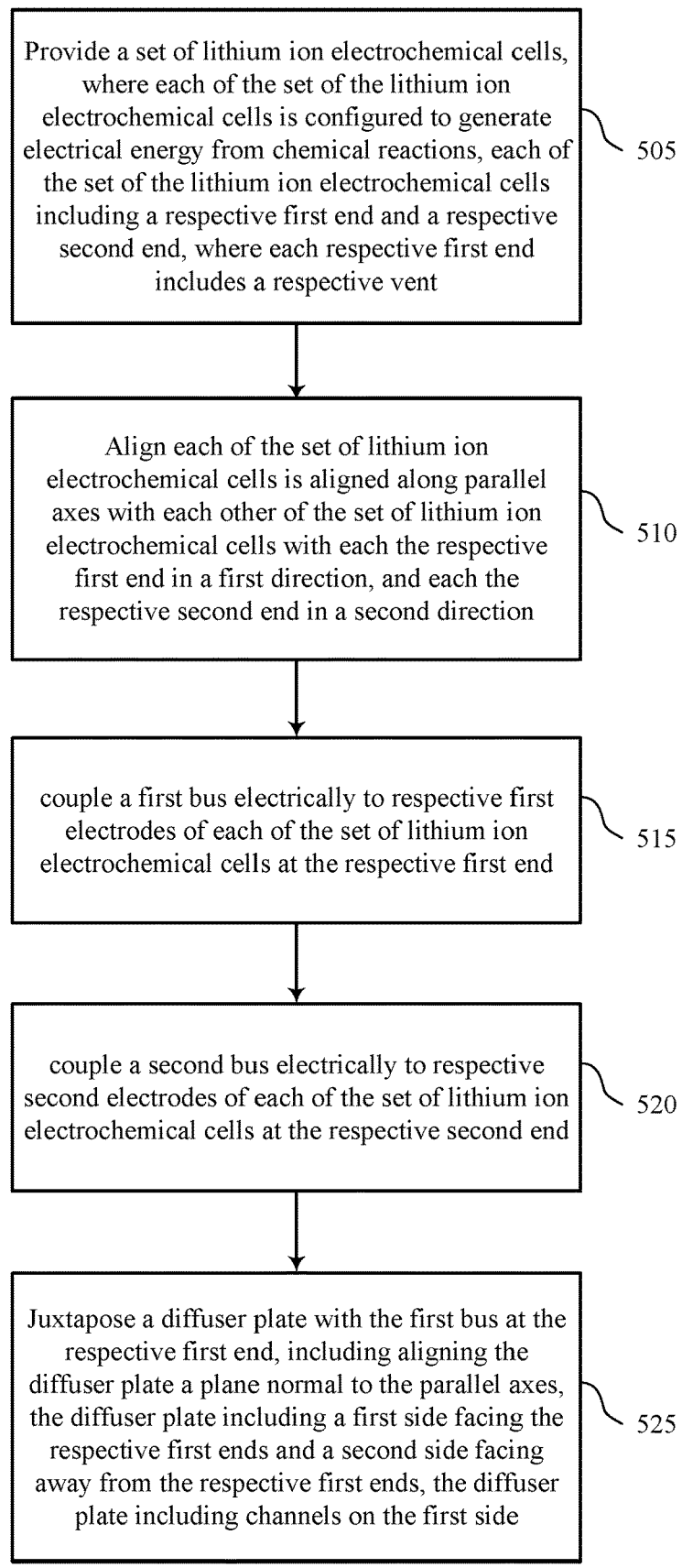
FIG. 5 illustrates an example of a process performed by a manufacturing system for preventing battery failure by preventing cell failure propagation in accordance with aspects of the present disclosure.

FIG. 5 illustrates an example of a process performed by a manufacturing system for preventing battery failure by preventing cell failure propagation in accordance with aspects of the present disclosure. In some examples, a manufacturing system may execute a set of codes to control functional elements of the manufacturing system to perform the described functions.

Additionally or alternatively, a manufacturing system may use special-purpose hardware. These operations may be performed according to the methods and processes described in accordance with aspects of the present disclosure. For example, the operations may be composed of various sub-steps, or may be performed in conjunction with other operations described herein.

At block 505 the manufacturing system may provide a plurality of lithium ion electrochemical cells, wherein each of the plurality of the lithium ion electrochemical cells is configured to generate electrical energy from chemical reactions, each of the plurality of the lithium ion electrochemical cells comprising a respective first end and a respective second end, wherein each respective first end comprises a respective vent. In a variation, each respective second end may comprise a respective vent, either in lieu of the respective vent of the first end of in addition to the respective vent of the first end.

At block 510 the manufacturing system may align each of the plurality of lithium ion electrochemical cells is aligned along parallel axes with each other of the plurality of lithium ion electrochemical cells with each the respective first end in a first direction, and each the respective second end in a second direction.

At block 515 the manufacturing system may couple a first bus electrically to respective first electrodes of each of the plurality of lithium ion electrochemical cells at the respective first end.

At block 520 the manufacturing system may couple a second bus electrically to respective second electrodes of each of the plurality of lithium ion electrochemical cells at the respective second end.

At block 525 the manufacturing system may juxtapose a diffuser plate with the first bus at the respective first end, comprising aligning the diffuser plate a plane normal to the parallel axes, the diffuser plate comprising a first side facing the respective first ends and a second side facing away from the respective first ends, the diffuser plate comprising channels on the first side.

While the invention herein disclosed has been described by means of specific embodiments, examples and applications thereof, numerous modifications and variations could be made thereto by those skilled in the art without departing from the scope of the invention set forth in the claims.

What is claimed is:

1. A method of providing a system for preventing battery failure, comprising:

providing a plurality of lithium ion electrochemical cells, wherein each of the plurality of the lithium ion electrochemical cells is configured to generate electrical energy from chemical reactions, each of the plurality of the lithium ion electrochemical cells comprising a respective first end and a respective second end, wherein each respective first end comprises a respective vent, aligning each of said plurality of lithium ion electrochemical cells along parallel axes with each other of said plurality of lithium ion electrochemical cells with each said respective first end in a first direction, and each said respective second end in a second direction;

coupling a first bus electrically to respective first electrodes of each of said plurality of lithium ion electrochemical cells at said respective first end;

coupling a second bus electrically to respective second electrodes of each of said plurality of lithium ion electrochemical cells at said respective second end;

juxtaposing a diffuser plate with said first bus at said respective first end, comprising aligning the diffuser plate with a plane normal to the parallel axes, the diffuser plate comprising a first side facing the respective first ends and a second side facing away from the respective first ends, the diffuser plate comprising channels for venting gases on said first side, the diffuser plate further comprising a plurality of diverters, each diverter including at least one arc protruding from said first side and at least one gap, wherein each arc comprises a curved cross-section oriented parallel to the diffuser plate alignment, wherein the gaps in the diverters form the channels;

coupling a third bus electrically to respective second electrodes of each of said plurality of lithium ion electrochemical cells at said respective second end; and juxtaposing a heat sink layer with said second bus, wherein the heat sink layer is interposed between the second bus and the third bus.

2. The method of claim 1, wherein:
said plurality of lithium ion electrochemical cells comprises at least two lithium ion electrochemical cells.

3. The method of claim 1, further comprising:
interposing a foam cell support comprising a plurality of tubes, each of which holds one of said plurality of lithium ion electrochemical cells, in a spaced-apart relationship relative to others of said plurality of lithium ion electrochemical cells.

4. The method of claim 3, wherein:
said foam cell support comprises polyurethane.

5. The method of claim 1, further comprising:
interposing a first glass epoxy composite material interposed between said first bus and each of said plurality of said lithium ion electrochemical cells at said respective first end; and
interposing a second glass epoxy composite material interposed between said second bus and each of said plurality of said lithium ion electrochemical cells at said respective second end.

6. The method of claim 5, wherein:
said first glass epoxy composite material comprises G10; and
said second glass epoxy composite material comprises G10.

7. The method of claim 1, wherein:
said heat sink layer comprises a phase change material.

8. The method of claim 1, further comprising:
interposing a fuse between the second bus and the third bus.

9. The method of claim 1, further comprising:
coupling a fuse to one of said first bus and said second bus.

10. The method of claim 1, wherein:
said first bus comprises nickel; and
said second bus comprises nickel.

11. The method of claim 1, wherein:
the diffuser plate further comprises overflow chambers configured to accommodate molten debris collection and swelling of the plurality of lithium ion electrochemical cells.

12. The method of claim 1, wherein:
the gaps in the diverters are arranged to divert vented gases from each lithium ion electrochemical cell in a direction that does not directly face any other adjacent lithium ion electrochemical cell.

13. The method of claim 1, wherein:
each respective second end comprises a respective vent.

14. The method of claim 13, further comprising:
juxtaposing a second diffuser plate with said second bus at said respective second end, comprising aligning the second diffuser plate with a plane normal to the parallel axes, the second diffuser plate comprising a first side facing the respective second ends and a second side facing away from the respective second ends, the second diffuser plate comprising channels on said first side, the second diffuser plate further comprising a plurality of diverters, each diverter including at least one arc protruding from said first side and at least one gap, wherein each arc comprises a curved cross-section oriented parallel to the second diffuser plate alignment, wherein the gaps in the diverters form the channels of the second diffuser plate.

15. The method of claim 1, wherein:
the diffuser plate comprises a metallic material.

16. The method of claim 1, wherein:
each diverter is located directly above one lithium ion electrochemical cell.

17. The method of claim 1, wherein the third bus includes a group fuse component.

* * * * *